(12) United States Patent
Chen

(10) Patent No.: US 8,203,853 B2
(45) Date of Patent: Jun. 19, 2012

(54) CHIP FILTER AND THE RELATED SUPPLEMENTARY TOOL

(75) Inventor: Po-Jung Chen, Taoyuan (TW)

(73) Assignee: U.D. Electronic Corp., Taoyuan (TW)

(*) Notice: Subject to any disclaimer, the term of this patent is extended or adjusted under 35 U.S.C. 154(b) by 25 days.

(21) Appl. No.: 12/929,032

(22) Filed: Dec. 23, 2010

(65) Prior Publication Data

US 2011/0095847 A1 Apr. 28, 2011

Related U.S. Application Data

(63) Continuation-in-part of application No. 12/461,835, filed on Aug. 26, 2009, now abandoned.

(51) Int. Cl.
*H05K 7/02* (2006.01)

(52) U.S. Cl. .......... 361/811; 361/809; 361/836; 336/90; 336/65; 439/620.22

(58) Field of Classification Search .................. 361/809, 361/807, 811, 836; 174/520; 336/65, 90; 439/620.22
See application file for complete search history.

(56) References Cited

U.S. PATENT DOCUMENTS

| | | | |
|---|---|---|---|
| 4,975,671 A | 12/1990 | Dirks | |
| 5,455,741 A * | 10/1995 | Wai et al. | 361/761 |
| 5,656,985 A | 8/1997 | Lu et al. | |
| 5,986,894 A * | 11/1999 | Lint et al. | 361/813 |
| 6,225,560 B1 | 5/2001 | Machado | |
| 6,297,720 B1 | 10/2001 | Lu et al. | |
| 6,297,721 B1 | 10/2001 | Lu et al. | |
| 6,344,785 B1 | 2/2002 | Lu et al. | |
| 6,395,983 B1 | 5/2002 | Gutierrez | |
| 6,512,175 B2 | 1/2003 | Gutierrez | |
| 6,593,840 B2 | 7/2003 | Morrison et al. | |
| 6,691,398 B2 * | 2/2004 | Gutierrez | 29/592.1 |
| 6,877,211 B2 | 4/2005 | Machado | |
| 6,912,781 B2 | 7/2005 | Morrison et al. | |
| 7,948,771 B2 * | 5/2011 | Zhang et al. | 361/809 |
| 2010/0142173 A1 * | 6/2010 | Chen | 361/811 |

* cited by examiner

*Primary Examiner* — Dameon Levi
(74) *Attorney, Agent, or Firm* — Bacon & Thomas, PLLC

(57) ABSTRACT

A chip filter and supplementary tool combination is disclosed. The chip filter includes a insulative holder base having two arrays of wire grooves arranged along two opposing sidewalls thereof and soldering zones defined in a finished surface on each sidewall corresponding to the wire grooves, connection terminals each having a base portion respectively embedded in the soldering zones in the sidewalls of the insulative holder base and a soldering surface respectively kept in flush with the top edge of the associating sidewall, and filter elements having lead wires thereof respectively extending out of the insulative holder base through the wire grooves and respectively rested on the soldering surfaces of the connection terminals and held down in position by the supplementary tool for soldering by an automatic soldering machine.

11 Claims, 15 Drawing Sheets

CHIP FILTER AND THE RELATED SUPPLEMENTARY TOOL

This application is a Continuation-In-Part of application Ser. No. 12/461,835, filed on Aug. 26, 2009, now pending. The patent application identified above is incorporated here by reference in its entirety to provide continuity of disclosure.

BACKGROUND OF THE INVENTION

1. Field of the Invention

The present invention relates to chip filter fabrication technology and more particularly, to a chip filter and supplementary tool, which facilitates bonding the lead wires of filter elements of the chip filter to the respective connection terminals, saving much labor and time and improving the productivity.

2. Description of the Related Art

Following development of electronic information products toward fine and delicate design, SMT (Surface Mount Technology) is commonly used for the bonding of electronic components to a circuit board. Further, during signal transmission of a network interface component, for example, RJ-45 Connector, it may cause an electromagnetic interference with surrounding electronic components or circuits, or the surrounding noises may interfere with the transmission of signal through the RJ-45 connector, resulting a signal transmission error. The electromagnetic interference may disturb surrounding wireless signal transmission, affecting normal functioning of the local area network. To avoid these problems, a signal filter module is usually used and set in the RJ-45 connector. A signal filter module for this purpose is a chip type module. It can be bonded to a network circuit board or interface card (not limited to RJ-45 connector). After installation of a signal filter module in a network connector, the signal filter module removes noises from the signal being transmitted from an external signal source into the network connector for further transmission to an external control circuit interface or any other of a variety of data transmission interface means. After conversion of a network signal into a series data signal, the signal can then be processed through a data processing system.

FIGS. 12 and 13 show a signal filter module according to the prior art. According to this design, the signal filter module comprises an electrically insulative housing A, a plurality of metal terminals B, a plurality of filter elements C and an electrically insulative top cover D. The metal terminals B are respectively fixedly secured to the two opposite sidewalls A1 of the electrically insulative housing A by insert molding. The metal terminals B extend vertically from the bottom side of the sidewalls A1 to the top side thereof, each having a bonding tip B1 turned perpendicularly out of the bottom side of the electrically insulative housing A and bonded to one respective copper finger E1 of an external circuit board E and a top pin B2 protruding over the topmost edge of the electrically insulative housing A. The filter elements C have lead wires C1 wound round the top pins B2 of the metal terminals B and then soldered thereto. This design of signal filter module has drawbacks as follows:

1. Winding the lead wires C1 of the filter elements C round the top pins B2 of the metal terminals B wastes much time and labor, complicating the operation and increasing the cost.
2. Because the metal terminals B extend through the height of the electrically insulative housing A, they must have a certain length, increasing the material cost.
3. Because the top pins B2 of the metal terminals B protrude over the topmost edge of the electrically insulative housing A for the fastening of the lead wires C1 of the filter elements C, the top cover D is necessary for protection. The use of the top cover D complicates the fabrication and cost of the signal filter module.

Further, FIG. 14 and FIG. 15 illustrate an advanced electronic microminiature package and method disclosed in U.S. Pat. No. 6,225,560. As illustrated, the advanced microelectronic component package includes a base element F, microelectronic component(s) G and conductors H. The base element F generally includes one or more sidewalls F1 and one or more recesses F0 which are adapted to receive the microelectronic component(s) G during assembly. The base element F further includes a plurality of raised elements F2 which are integrally formed with the sidewalls F1 in a vertical orientation adjacent to one another. A cavity F11 between the raised element F2 and the sidewall F1 designed to receive the wire G1 associated with the microelectronic component(s) G, and channels F3 formed by adjacent raised elements F2. Each raised element F2 includes a semicircular recess F20 aimed at one cavity F11 for receiving the wire G1, two holes F201 in communication between the semicircular recess F20 and the associating channels F3. Wires G1 are set in the cavities F11 at the sidewalls F1 and guided through the semicircular recesses F20 and the respective holes F201 to the associating channels F3 and then bonded to the conductors H. In actual practice, this design has drawbacks as follows:

1. When wires G1 are set in the cavities F11, they cannot be directly bonded to the conductors H. Wires G1 must be curved and inserted into the respective semicircular recesses F20 and then into the respective holes F201 to the associating channels F3 for bonding to the conductors H. When wires G1 are inserted into the semicircular recesses F20, they may be stuck and cannot be inserted through the respective holes F201 to the associating channels F3 for bonding to the conductors H. Thus, connection between the wires G1 and the conductors H is complicated.
2. The design of the raised elements F2, sidewalls F1, cavities F11, semicircular recesses F20 and holes F201 complicates the structure of the base element F. In consequence, the tool for making the base element F is complicated and costs a lot.
3. When wires G1 are inserted through the holes F201 to the associating channels F3, the conductors H must be set in the channels F3 and then bonded to the wires G1. It takes much labor and time to set the wires G1 and the conductors H in position for bonding, increasing the cost and lowering the productivity.

Therefore, there is a need to provide a chip filter and supplementary tool that eliminates the drawbacks of the aforesaid prior art design.

SUMMARY OF THE INVENTION

The present invention has been accomplished under the circumstances in view. It is one object of the present invention to provide a chip filter and supplementary tool, which facilitates bonding the lead wires of filter elements of the chip filter to the respective connection terminals, saving much labor and time and improving the productivity.

To achieve this and other objects of the present invention, a chip filter includes a insulative holder base having two arrays of wire grooves arranged along two opposing sidewalls thereof and soldering zones defined in a finished surface on each sidewall corresponding to the wire grooves, connection terminals each having a base portion respectively embedded in the soldering zones in the sidewalls of the insulative holder base and a soldering surface respectively kept in flush with the top edge of the associating sidewall, and filter elements having lead wires thereof respectively extending out of the insulative holder base through the wire grooves and respectively rested on the soldering surfaces of the connection terminals and held down in position by the supplementary tool for soldering by an automatic soldering machine.

Further, the base portion of each connection terminal of the chip filter has a width greater than the width of the wire grooves of the insulative holder base. Further, the bonding tip of each connection terminal of the chip filter extends outwardly from an outer end of the associating base portion outside the associating sidewall of the insulative holder base. Further, each connection terminal of the chip filter has an opening defined in a front side relative to the base portion at one side of the bonding tip thereof and aimed at one wire groove, facilitating positioning of the lead wires for quick and accurate bonding.

Further, the base portions of the connection terminals of the chip filter are positioned in the sidewalls of the insulative holder base during molding of the insulation holder base, and each connection terminal has an interference block extended upwardly from one end of the associating base portion opposite to the associating bonding tip and embedded in one sidewall of the insulative holder base. Thus, the material consumption of the connection terminals is minimized, and the installation of the connection terminals is simplified.

Further, subject to the application of the supplementary tool, the lead wires of the filter elements can be automatically set in the respective wire grooves of the insulative holder base and the respective locating grooves and secured to narrow crevices in tool base of the supplementary tool by a mechanical arm for quick bonding to the soldering surfaces of the base portions of the connection terminals by an automatic soldering machine, simplifying the fabrication and increasing the productivity.

DETAILED DESCRIPTION OF THE PREFERRED EMBODIMENT

Figure 1:
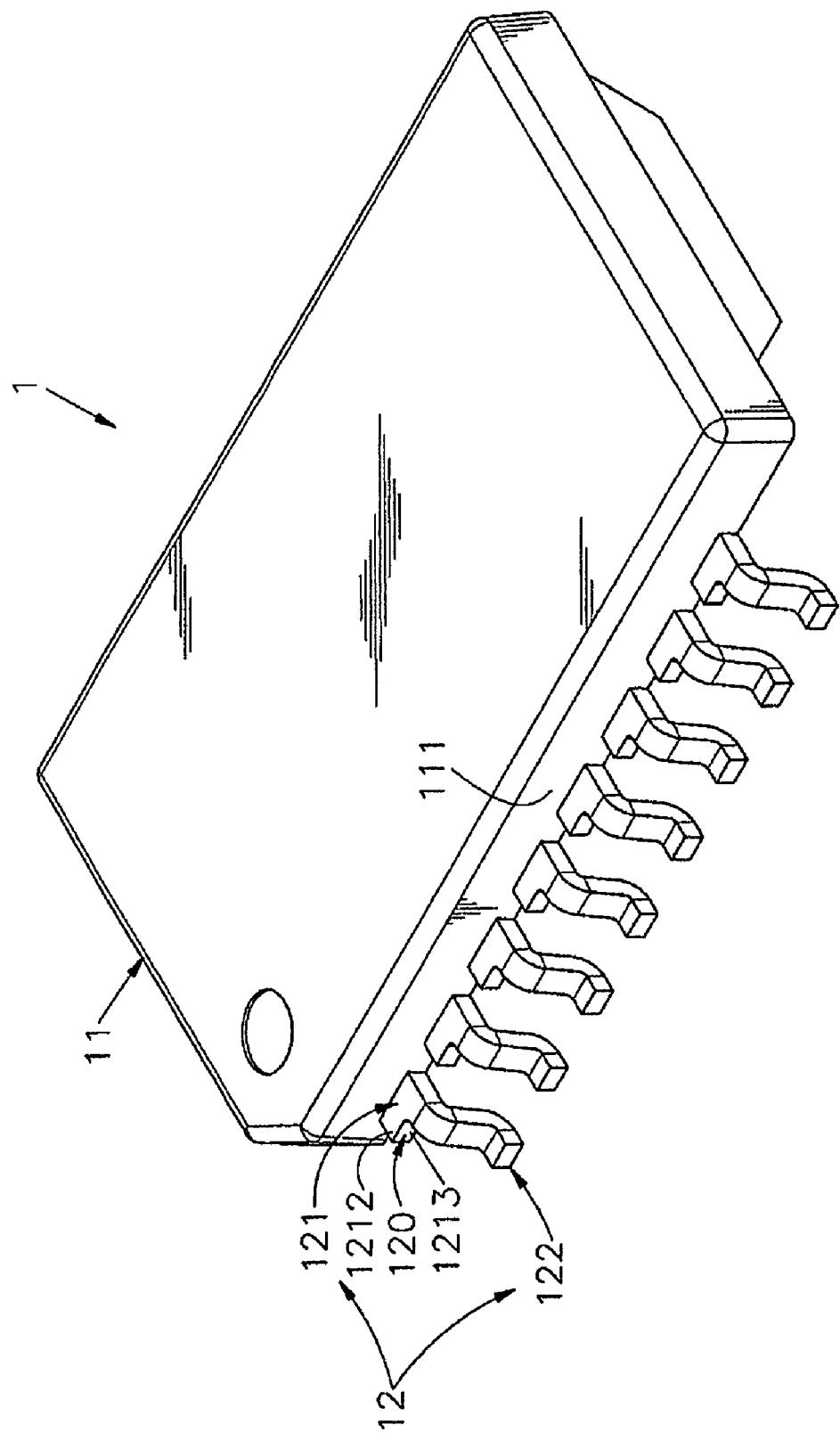
FIG. 1 is an oblique top elevational view of a chip filter in accordance with a first embodiment of the present invention.
Figure 2:
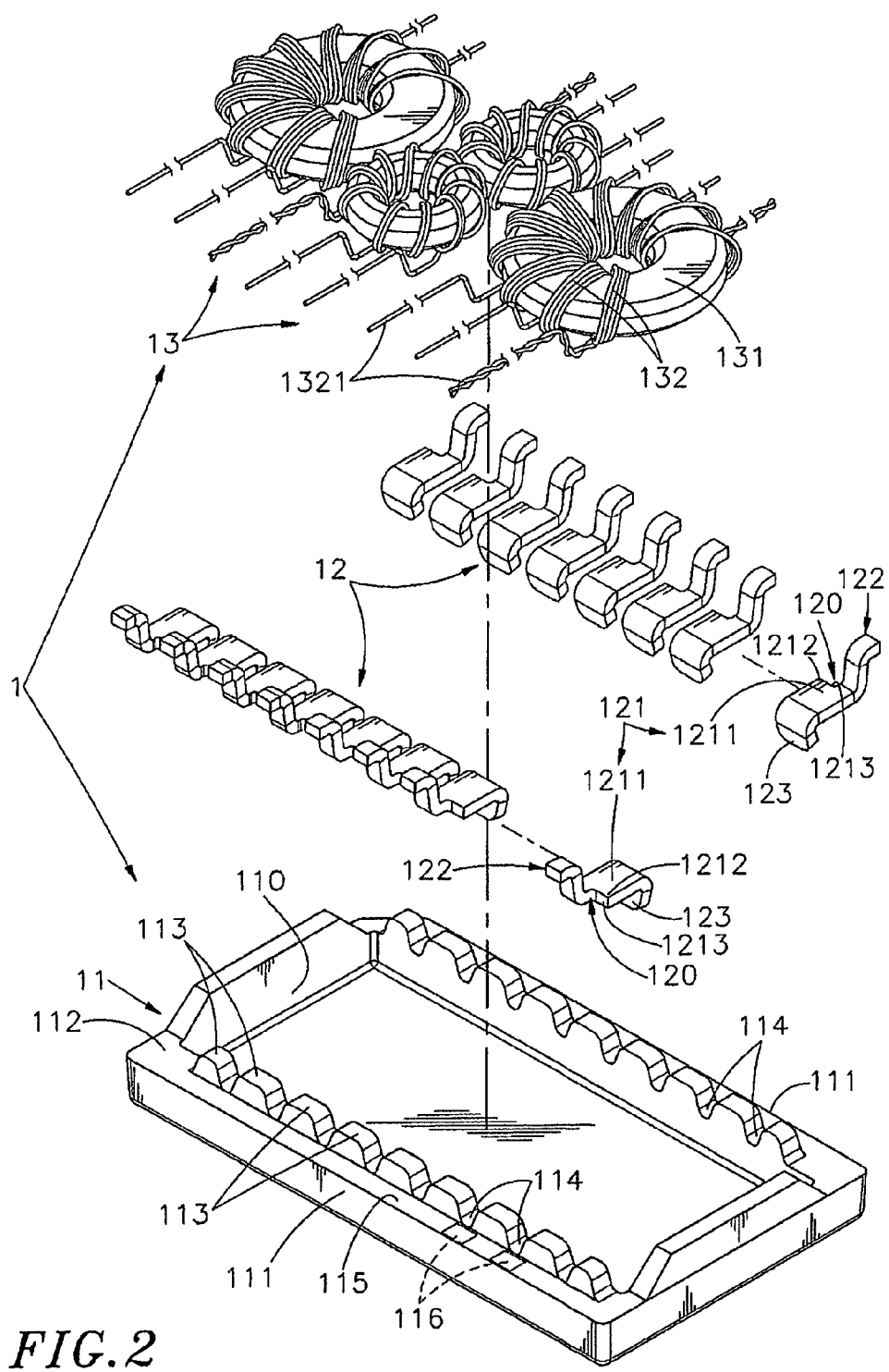
FIG. 2 is an exploded view of the chip filter in accordance with the first embodiment of the present invention.
Figure 3:
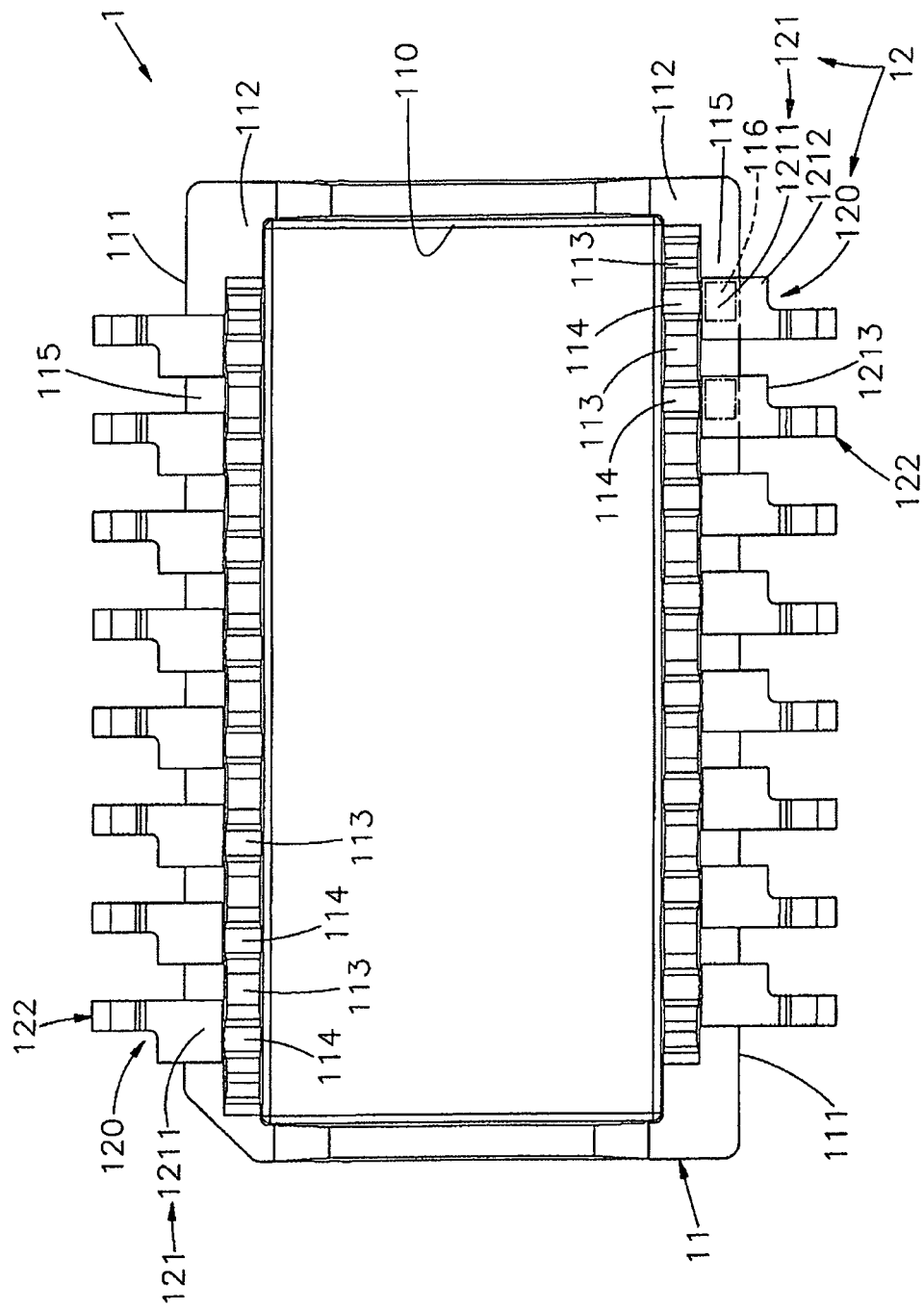
FIG. 3 is a top view of the chip filter in accordance with the first embodiment of the present invention.
Figure 4:
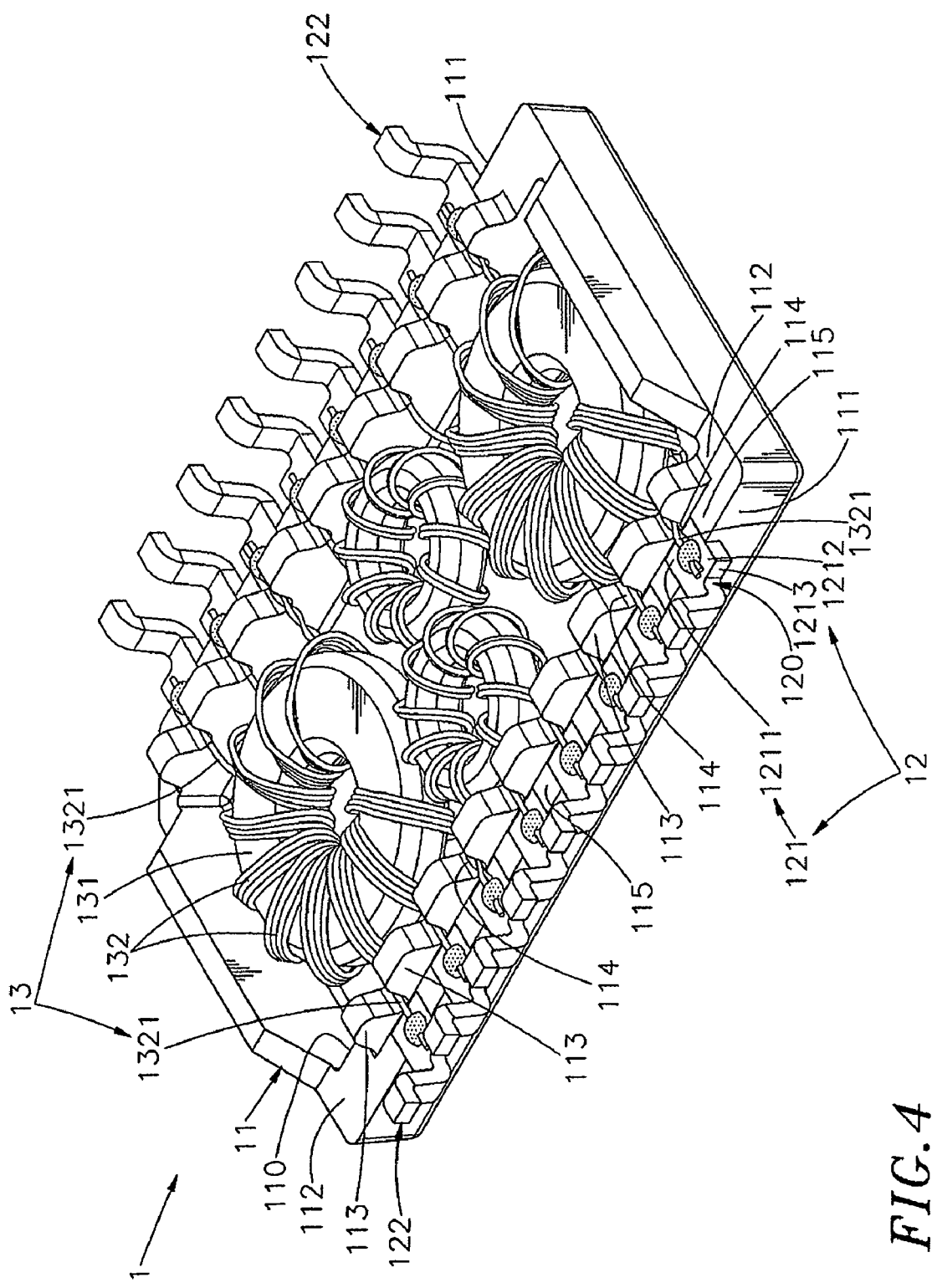
FIG. 4 is an oblique bottom elevational view of the chip filter in accordance with the first embodiment of the present invention.

Referring to FIGS. 1~4, a chip filter 1 in accordance with a first embodiment of the present invention is shown comprising an insulative holder base 11, a plurality of connection terminals 12, and a plurality of filter elements 13.

The insulative holder base 11 has two opposing sidewalls 111, a recessed chamber 110 defined between the two sidewalls 111, two arrays of protruding blocks 113 respectively arranged along the sidewalls 111 adjacent to the recessed chamber 110 and protruding over the flat top edge 112 of each of the sidewalls 111, a wire groove 114 defined between each two adjacent protruding blocks 113 of each array of protruding blocks 113, a finished surface 115 formed on the flat top edge 112 of each of the sidewalls 111, and a plurality of soldering zones 116 defined in the finished surface 115 corresponding to the wire grooves 114.

Figure 5:
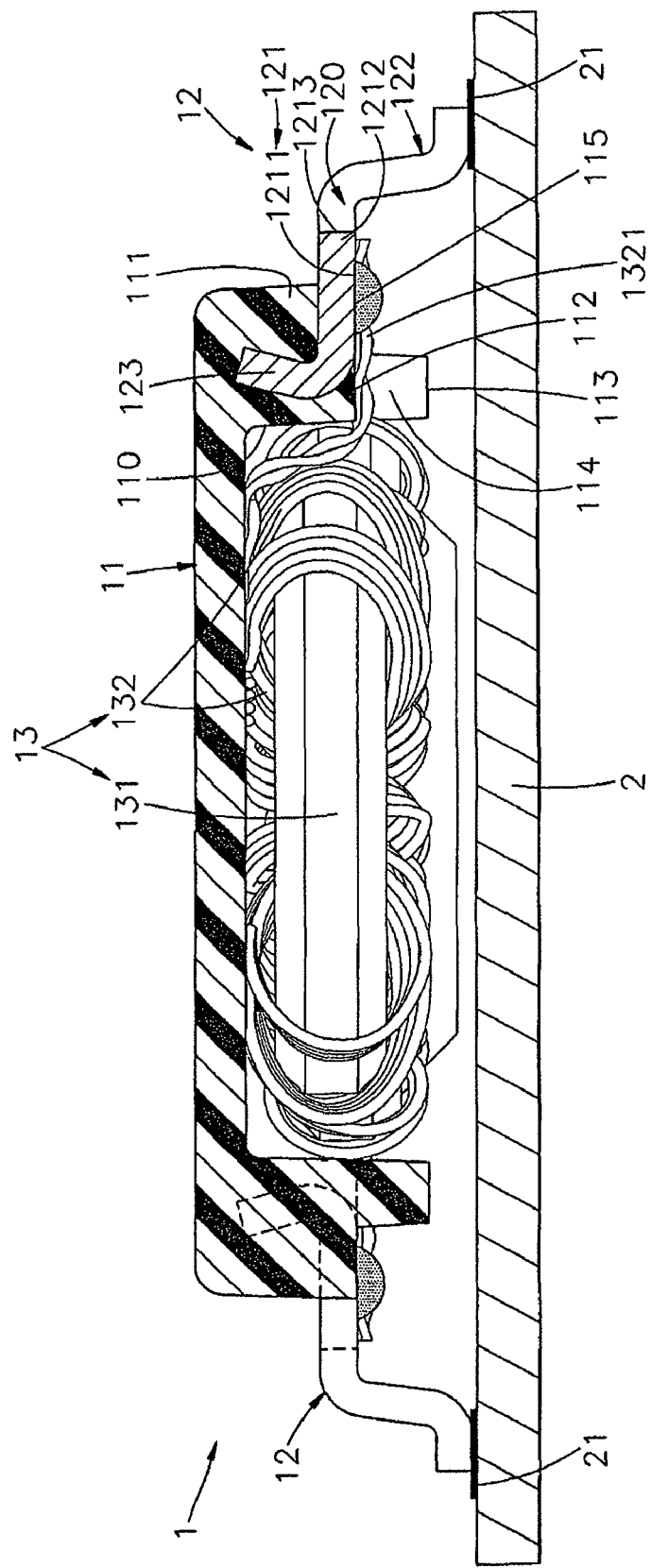
FIG. 5 is an applied view in section of the first embodiment of the present invention, illustrating the bonding tips of the connection terminals bonded to an external circuit board.

The connection terminals 12 are bonded to the sidewalls 111 corresponding to the protruding blocks 113 during injection molding of the insulative holder base 11, each having a base portion 121 respectively positioned in the soldering zones 116 in the finished surface 115 of each of the sidewalls 111, a soldering surface 1211 located on the base portion 121 and kept in flush with the top edge 112 of the associating sidewall 111, and a bonding tip 122 extended from the base portion 121 out of the associating sidewall 111 for bonding to one respective surface contact 21 at an external circuit board 2 (see FIG. 5).

The filter elements 13 are mounted in the recessed chamber 110 of the insulative holder base 11, each comprising a metal core 131 and windings 132 wound round the metal core 131. The terminal ends of the lead wires 1321 of the windings 132 are respectively extending out of the recessed chamber 110 of the insulative holder base 11 through the respective wire grooves 114 and respectively soldered to the soldering surfaces 1211 of the connection terminals 12. As space above the finished surface 115 of each of the sidewalls 111 is a wide and barrier-free space, the lead wires 1321 of the windings 132 can be soldered to the soldering surfaces 1211 of the connection terminals 12 conveniently at a time.

Further, the width of base portion 121 of each connection terminal 12 is greater than the width of the wire grooves 114; the base portion 121 is long enough to extend out of the associating sidewall 111, forming a flange 1212; the width of the bonding tip 122 of each connection terminal 12 is smaller than the width of base portion 121; the bonding tip 122 of each connection terminal 12 extends outwardly from one lateral side of the outer surface 1213 of the flange 1212 of the base portion 121 and is kept out of the extending direction of the axis of each of the wire grooves 114; the flange 1212 of the base portion 121 of each connection terminal 12 is kept in alignment with one respective wire groove 114 for the passing of one lead wire 1321 of one winding 132. When setting the lead wires 1321 of the windings 132 in the respective wire grooves 114, the terminal ends of the lead wires 1321 are respectively extended to the flanges 1212 of the base portions 121 of the connection terminals 12 and rested on the soldering surfaces 1211 of the respective connection terminals 12 facilitating soldering and avoiding a further alignment procedure.

Further, each connection terminal 12 has an interference block 123 obliquely upwardly extended from the opposite side of the base portion 121 out of the associating sidewall 111 and positioned in the inner side of the associating sidewall 111. Thus, the connection terminals 12 are constantly firmly secured to the respective sidewalls 111 even when the chip filter 1 faces a high temperature environment or the chip filter 1 is being detached from the external circuit board.

Referring to FIG. 5, during application of the chip filter 1, the bonding tips 122 of the connection terminals 12 are respectively bonded to respective surface contacts 21 of an external circuit board 2 conveniently by means of a bonding machine. Thus, the modularized structural design of the invention facilitates mass fabrication and reduces the defective rate, saving much manufacturing time and cost. Further, the external circuit board 2 can be a motherboard or interface card for signal transmission device, for example, RJ-45 network connector. When an external signal is transmitted through a cable to the circuit board 2, it will then be transmitted through the respective surface contacts 21 of the circuit board 2 to the connection terminals 12 in one sidewall 11 of the insulative holder base 11 and then to the lead wires 1321 at one side of the filter elements 13, enabling the filter elements 13 to remove noises from the signal. After filtration, the filtered signal is transmitted through the lead wires 1321 at the other side of the filter elements 13 to the connection terminals 12 in the other sidewall 11 of the insulative holder base 11 and then to the circuit board 2 for further output.

Figure 6:
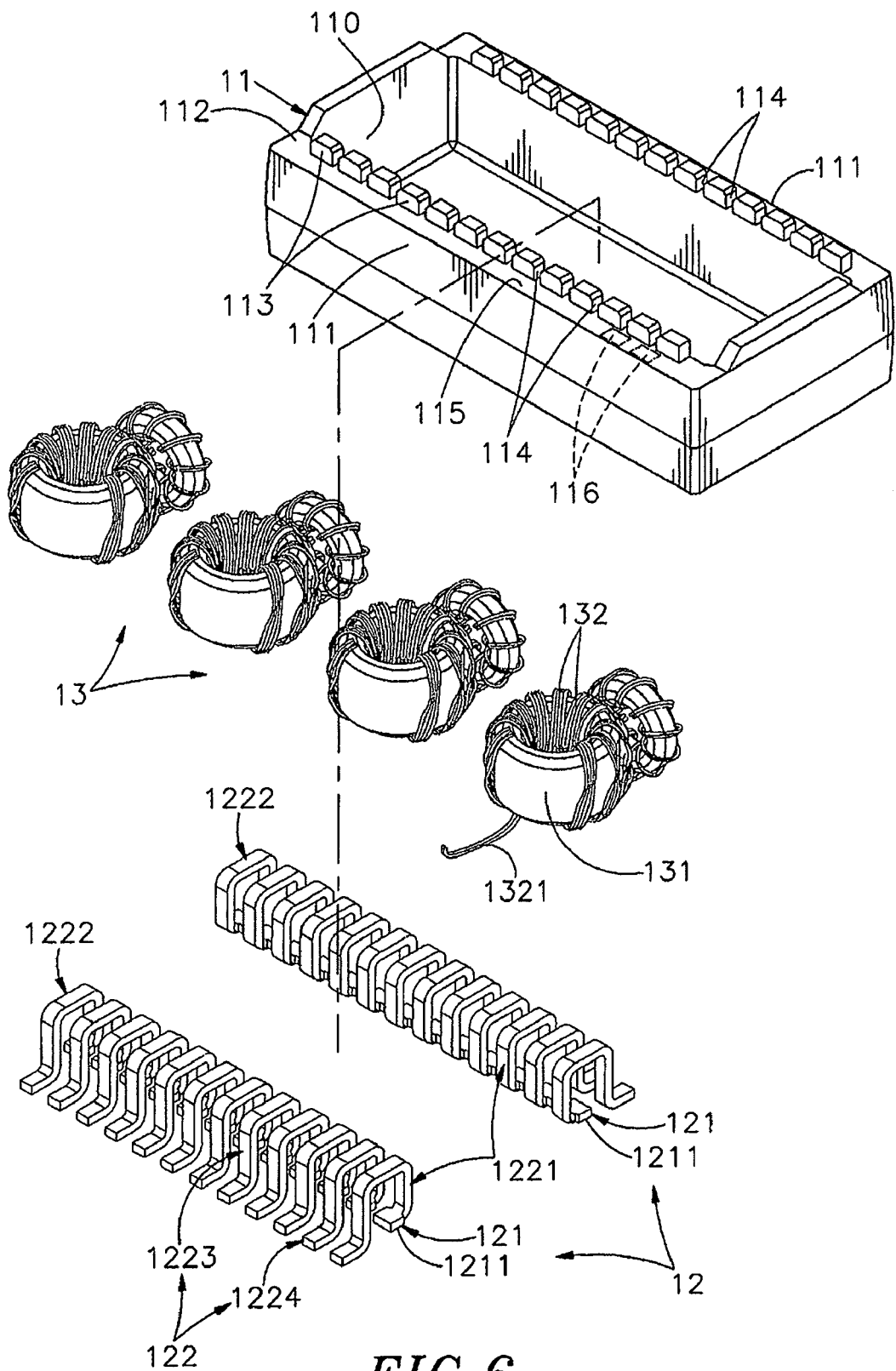
FIG. 6 is an exploded view of a chip filter in accordance with a second embodiment of the present invention.
Figure 7:
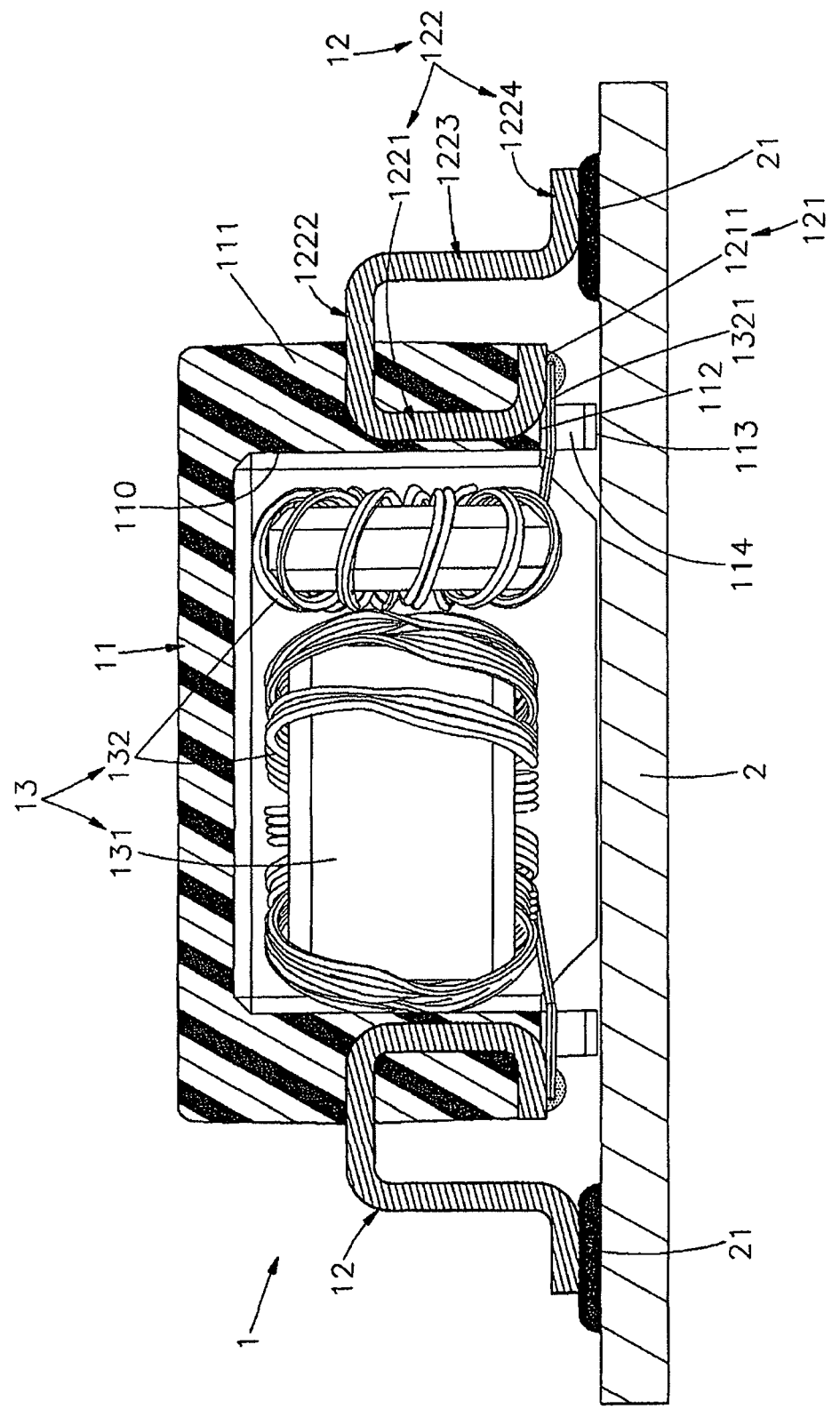
FIG. 7 is an applied view in section of the second embodiment of the present invention, illustrating the bonding tips of the connection terminals bonded to an external circuit board.

FIGS. 6 and 7 illustrate a chip filter in accordance with a second embodiment of the present invention. According to this alternate form, each connection terminal 12 comprises a base portion 121 bonded to one sidewall 111 corresponding to the location of one soldering zone 116 in the finished surface 115 of the associating sidewall 111, a soldering surface 1211 located on the base portion 121 and kept in flush with the top edge 112 of the associating sidewall 111, a bonding tip 122 extended from the base portion 121 out of the associating sidewall 111 for bonding to one respective surface contact 21 at an external circuit board 2 (see FIG. 7). The bonding tip 122 is generally inverted U-shaped having a vertical segment 1221 connected to the base portion 121 and embedded in the associating sidewall 111, a transverse segment 1222 extended from one end of the vertical segment 1221 remote from the base portion 121 to the outside of the associating sidewall 111, a supporting segment 1223 vertically downwardly extended from one end of the transverse segment 1222 remote from the vertical segment 1221 and suspending outside the insulative holder base 11, and a bonding segment 1224 perpendicularly outwardly extended from one end, namely, the bottom end of the supporting segment 1223 and soldered to one surface contact 21 of the external circuit board 2.

As stated above, each connection terminal 12 has a base portion 121 embedded in one sidewall 111 corresponding to the location of one soldering zone 116 in the finished surface 115 of the associating sidewall 111, a soldering surface 1211 located on the base portion 121 and kept in flush with the top edge 112 of the associating sidewall 111, a bonding tip 122 extended from the base portion 121 out of the associating sidewall 111 for bonding to one respective surface contact 21 at an external circuit board 2. The connection terminals 12 can be directly bonded to the sidewalls 111 of the insulative holder base 11 during molding of the insulative holder base 11. Alternatively, the connection terminals 12 can be affixed to the sidewalls 111 of the insulative holder base 11 after molding of the insulative holder base 11.

Figure 8:
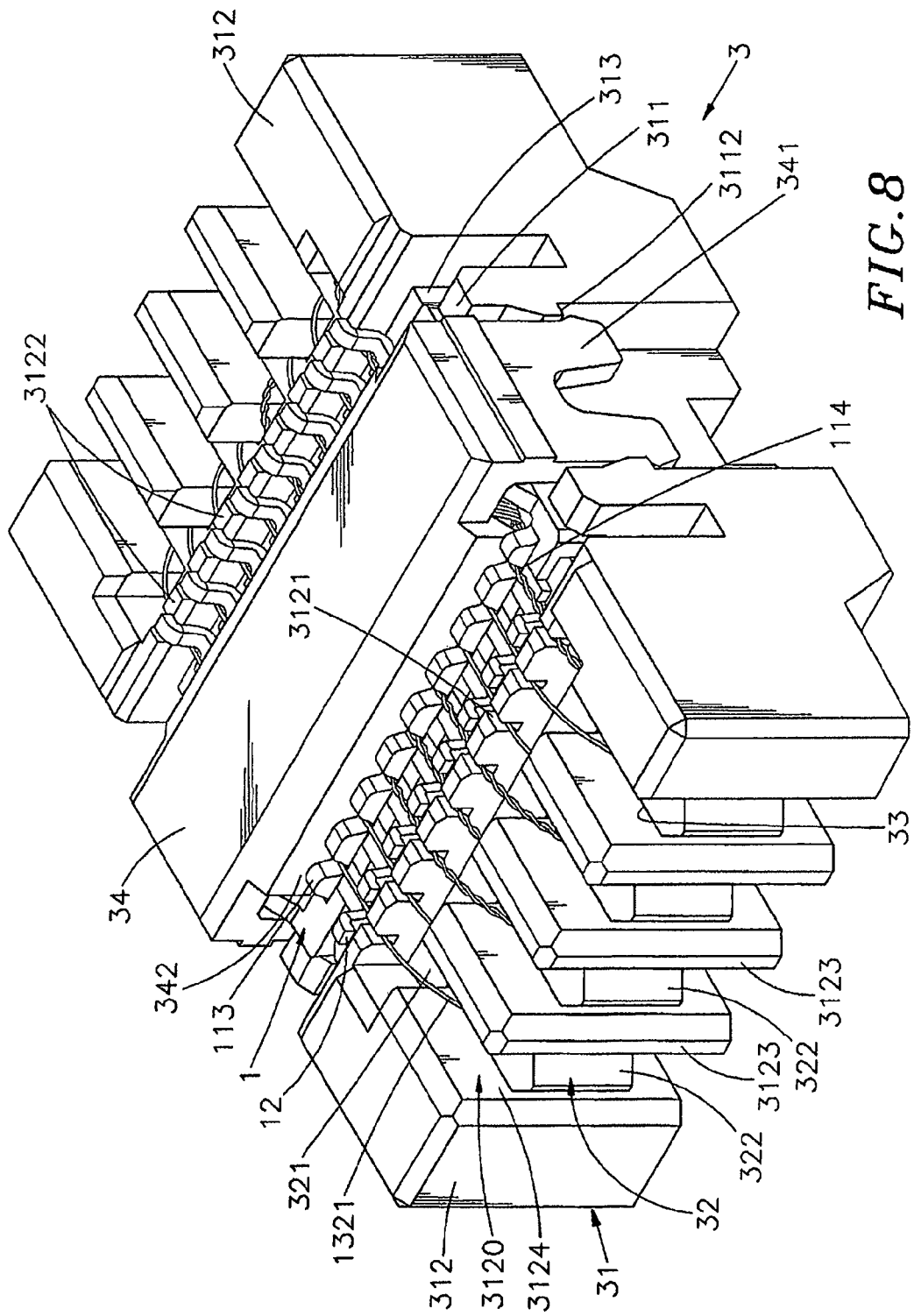
FIG. 8 is an applied view of a supplementary tool in accordance with the present invention.
Figure 9:
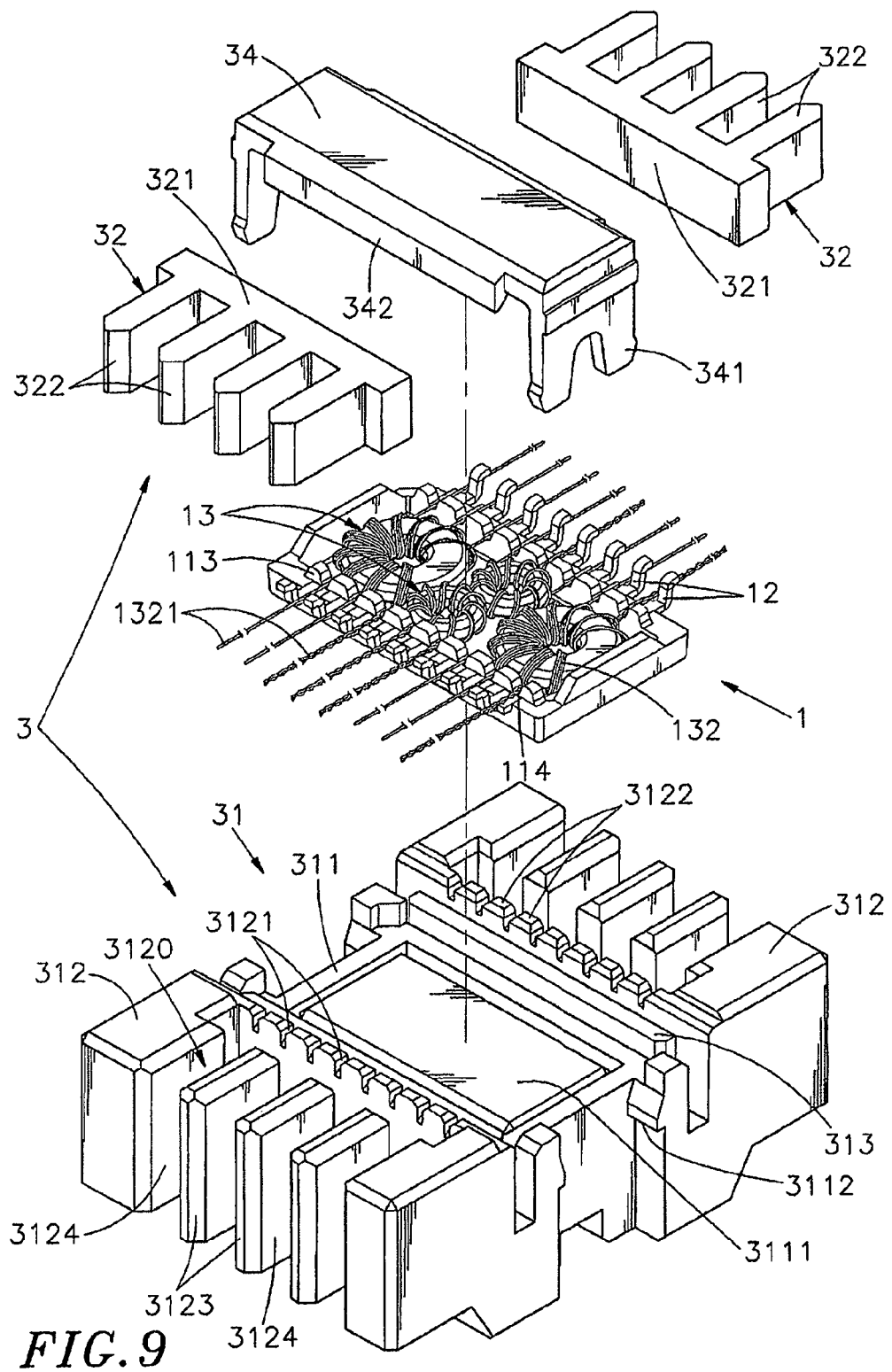
FIG. 9 is an exploded view of FIG. 8.
Figure 10:
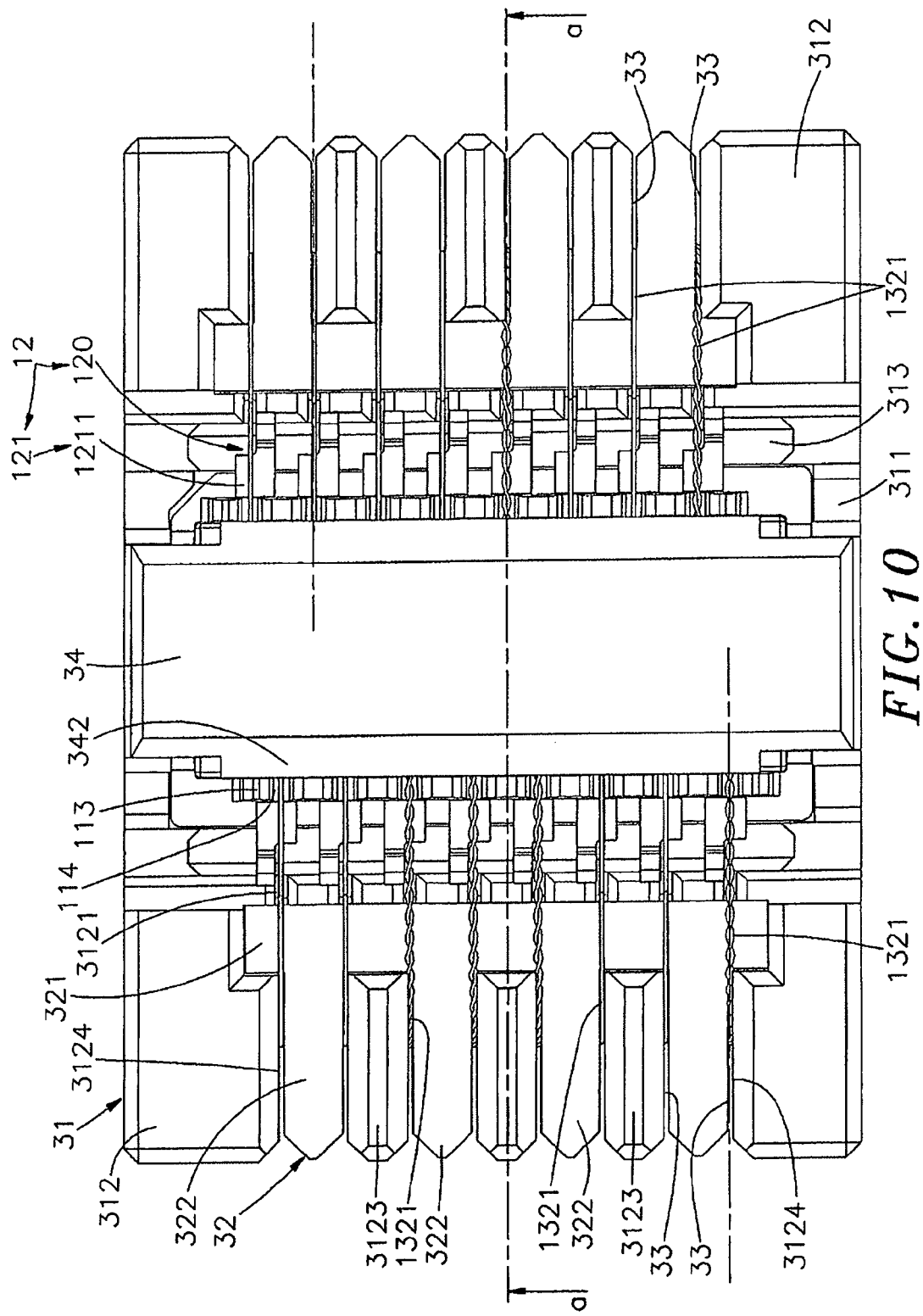
FIG. 10 is a top plain view of FIG. 8 in an enlarged scale.

Referring to FIGS. 8~10, the invention further provides a supplementary tool 3 to facilitating bonding the lead wires 1321 of the filter elements 13 to the connection terminals 12 at the sidewalls 111 of the insulative holder base 11. The supplementary tool 3 comprises a tool base 31 and two retaining blocks 32.

The tool base 31 comprises a top recess 311 for accommodating the insulative holder base 11, two pairs of stop blocks 312 bilaterally disposed at two opposite lateral sides relative to the top recess 311, a holding space 3120 defined between each pair of stop blocks 312 at each of the two opposite lateral sides of the top recess 311, a plurality of partition blocks 3123 and partition slots 3124 alternatively arranged in parallel in each holding space 3120 between the associating two stop blocks 312, a series of protruding blocks 3122 arranged along each of the two opposite lateral sides of the top recess 311 between the two stop blocks 312 at each of the two opposite lateral sides of the top recess 311, and a plurality of locating grooves 3121 respectively defined between each two adjacent protruding blocks 3122 at each of the two opposite lateral sides of the top recess 311.

The two retaining blocks 32 are respectively set in the two holding spaces 3120 at the two opposite lateral sides of the top recess 311 between the respective stop blocks 312, each having an elongated base 321 and a plurality of teeth 322 perpendicularly extended from one side the elongated base 321 in a parallel relationship and respectively inserted into the partition slots 3124 in each of the holding spaces 3120 such that a narrow crevice 33 is defined between one side of one tooth 322 and one respective partition block 3123 in axial alignment with one locating groove 3121 at each of the two opposite lateral sides of the top recess 311 (see FIG. 10).

Figure 11:
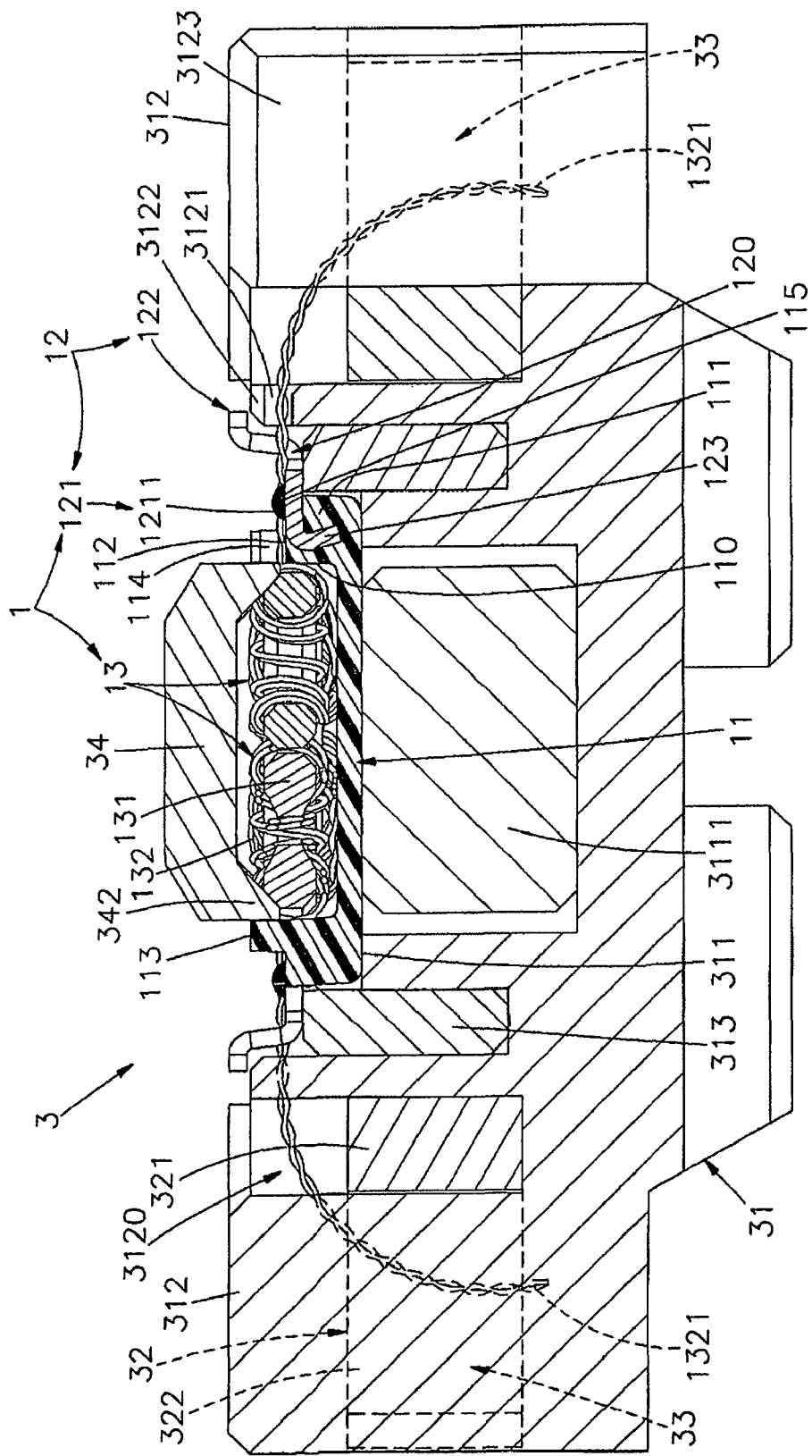
FIG. 11 is a sectional view taken along line a-a of FIG. 10.
Figure 12:
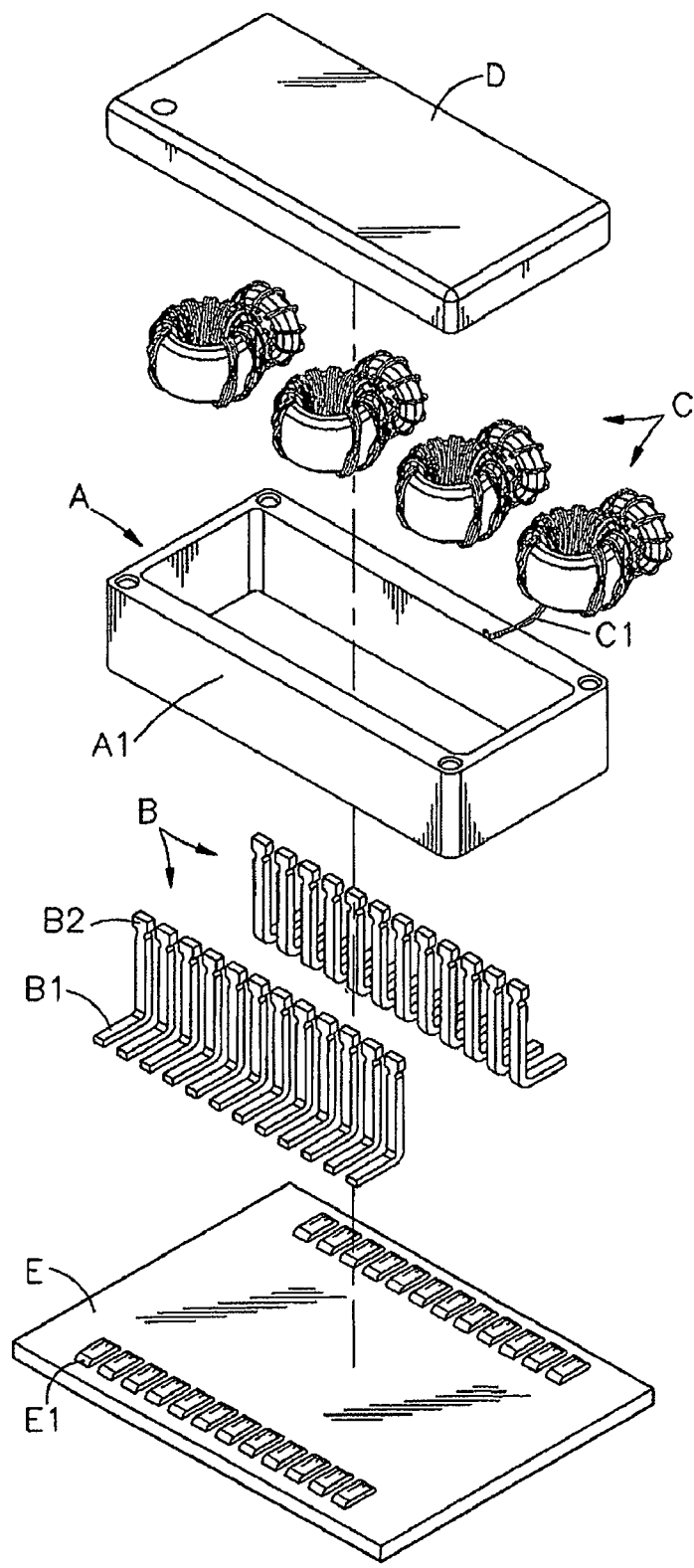
FIG. 12 is an exploded view of a chip filter according to the prior art.
Figure 13:
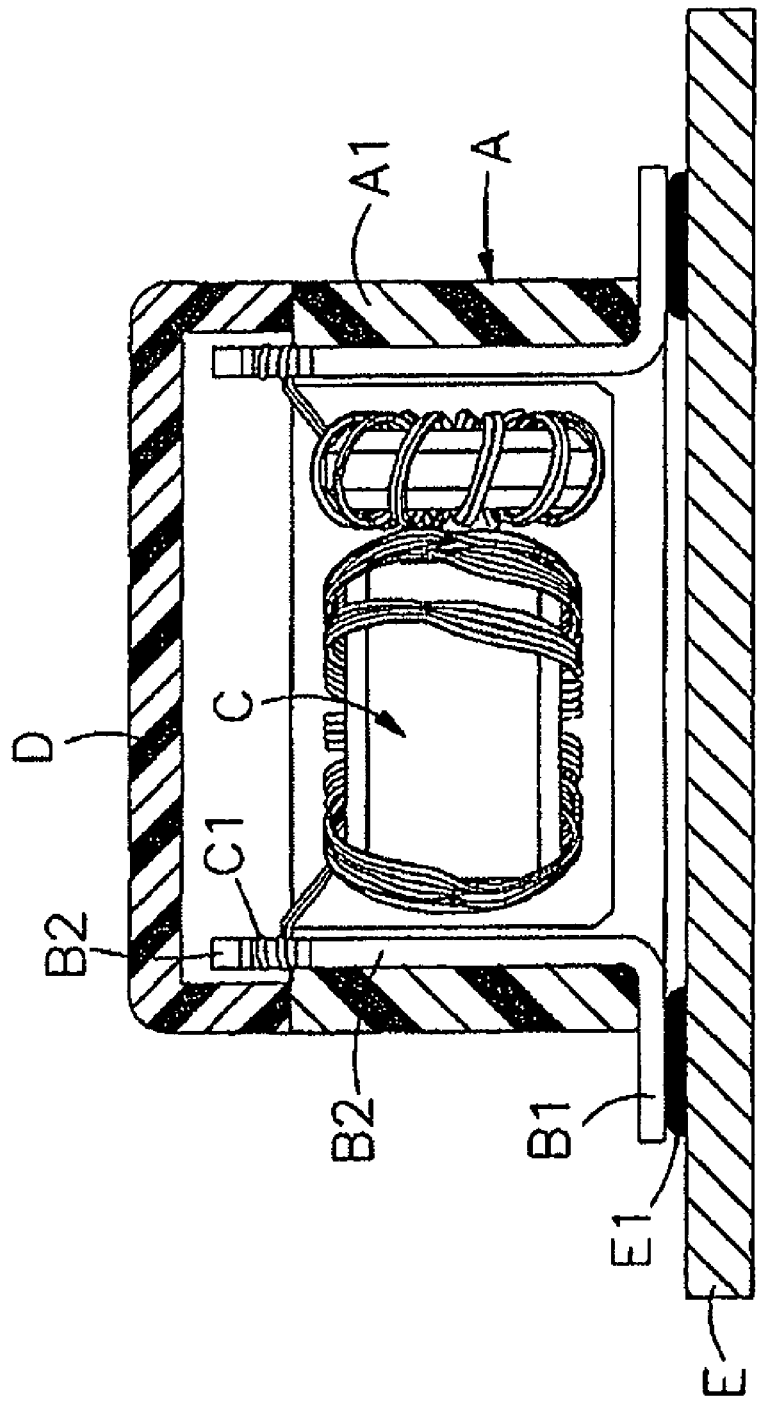
FIG. 13 is a sectional side view of the chip filter according to the prior art.
Figure 14:
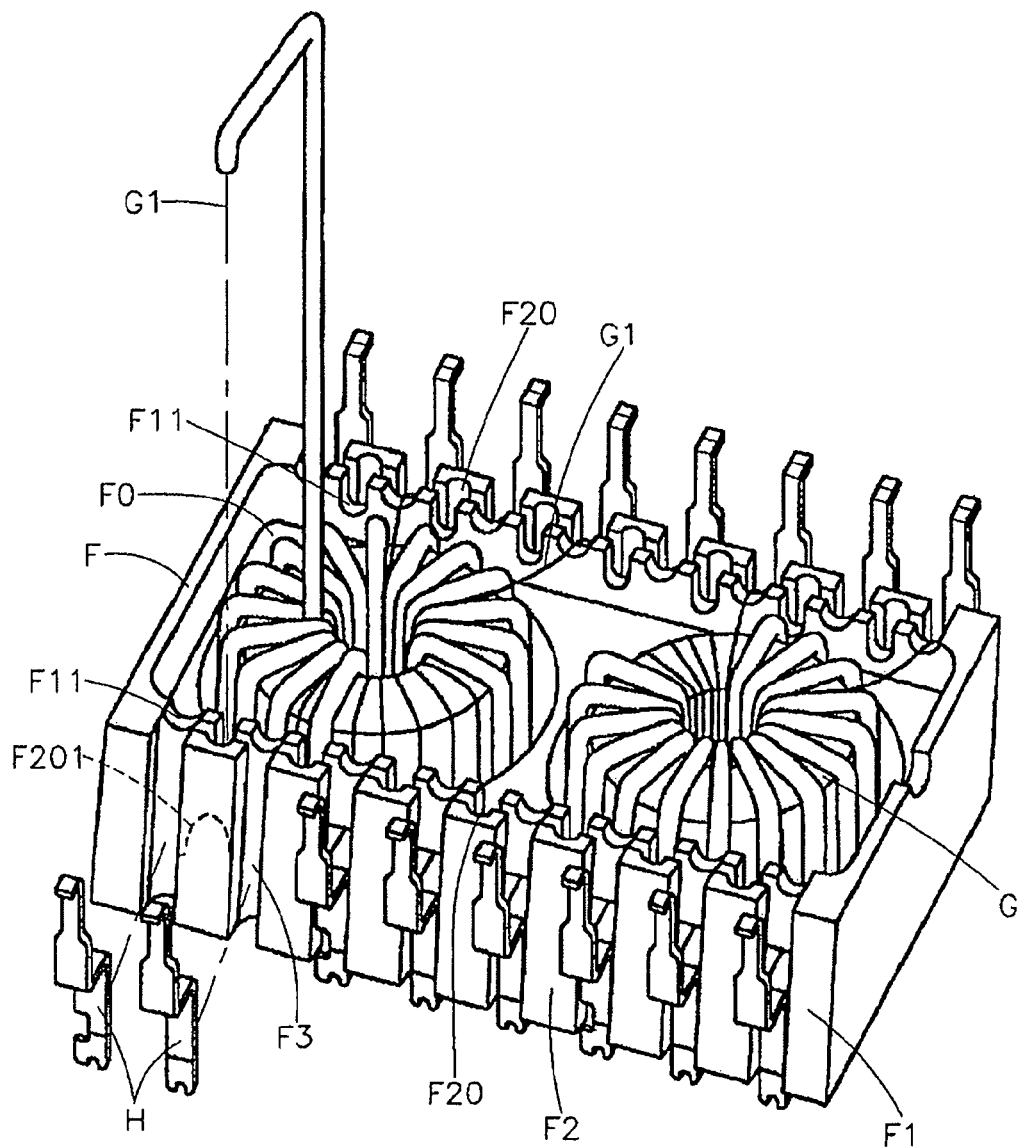
FIG. 14 is an exploded view of another structure of chip filter according to the prior art.
Figure 15:
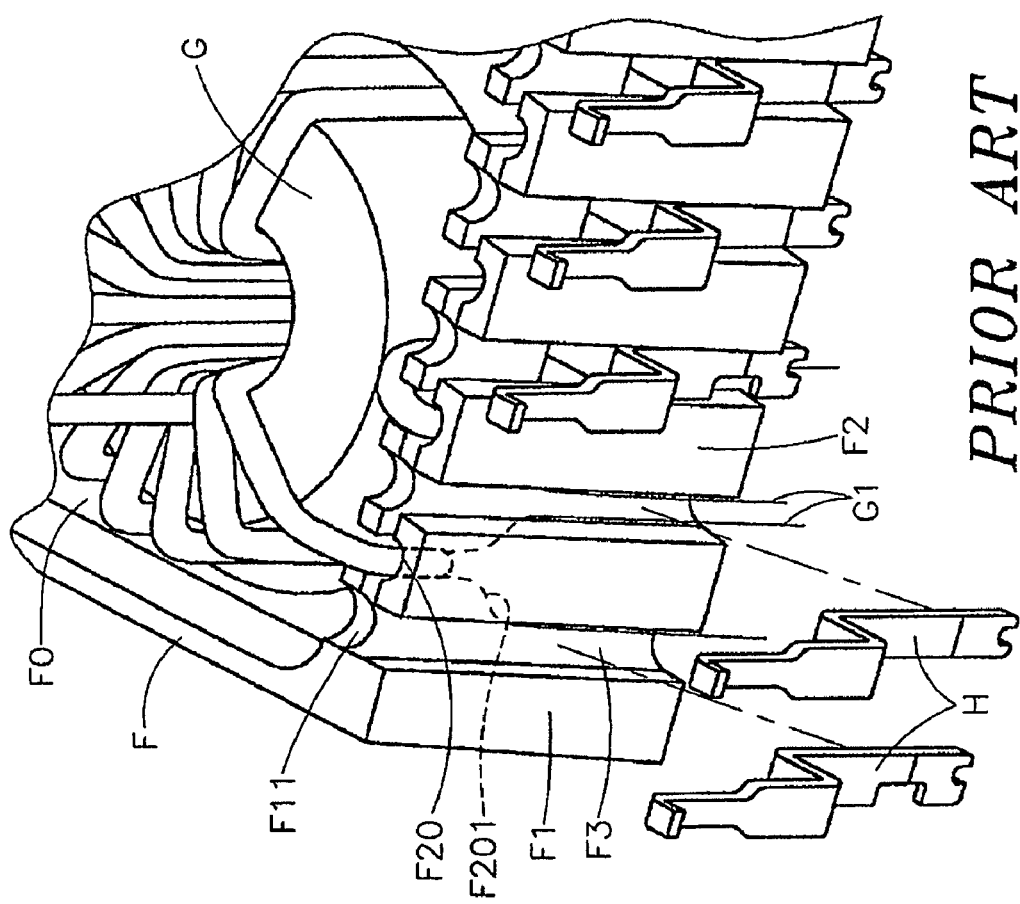
FIG. 15 is an enlarged view of a part of FIG. 14.

FIG. 11 is a sectional view taken along line a-a of FIG. 10, when going to solder the lead wires 1321 of the filter elements 13 to the connection terminals 12 at the sidewalls 111 of the insulative holder base 11, turn the insulative holder base 11 upside down and then put the insulative holder base 11 in the top recess 311 of the tool base 31 of the supplementary tool 3 to aim the connection terminals 12 at the protruding blocks 3122 respectively and to keep the wire grooves 114 of the insulative holder base 11 in axial alignment with the locating grooves 3121 and the narrow crevices 33 respectively, and then pull the lead wires 1321 of the filter elements 13 bilaterally outwardly toward the holding spaces 3120 of the tool base 31 of the supplementary tool 3, and then set the lead wires 1321 in the respective wire grooves 114 of the insulative holder base 11 and the respective locating grooves 3121 to have the lead wires 1321 be respectively supported on the soldering surfaces 1211 of the base portions 121 of the connection terminals 12. After the lead wires 1321 have been soldered to the soldering surfaces 1211 of the base portions 121 of the connection terminals 12, cut the unnecessary terminal ends of the lead wires 1321 that extends out of the soldered points (the soldering surfaces 1211 of the base portions 121 of the connection terminals 12, finishing the bonding operation. Further, the lead wires 1321 can be soldered to the soldering surfaces 1211 of the base portions 121 of the connection terminals 12 by means of reflow soldering or wave soldering.

Subject to the use of the supplementary tool 3, a mechanical arm can be used to pick up each unfinished chip filter 1 and to position each unfinished chip filter 1 and its lead wires 1321 in the supplementary tool 3 for enabling the lead wires 1321 of the filter elements 13 to be soldered to the respective connection terminals 12 by an automatic soldering machine rapidly and efficiently, simplifying chip filter fabrication and increasing the productivity.

Further, one of a set of different thicknesses of cushion pads 311 can be selectively attached to the top recess 311 of the tool base 31 of the supplementary tool 3 to adjust the depth of the top recess 311 subject to the specification of the chip filter 1 to be soldered. Further, different heights of supporting bars 313 are selectively and detachably attached to the tool base 31 of the supplementary tool 3 at the two opposite lateral sides of the top recess 311 for supporting the base portions 121 of the connection terminals 12 of the chip filter 1 to be soldered, adjusting the width of the narrow crevices 33 subject to the diameter of the lead wires 1321 of the filter elements 13 to be soldered.

Further, a cover member 34 may be used to cap the chip filter 1 on the tool base 31 of the supplementary tool 3 for soldering. The cover member 34 has two shoulders 342 symmetrically disposed at two opposite lateral sides thereof for setting in the top recess 110 to hold down the filter elements 13 of the chip filter 1 to be soldered, and a plurality of end hooks 341 symmetrically downwardly extended from two distal ends thereof and respectively detachably hooked in respective retaining grooves 3112 in the tool base 31 of the supplementary tool 3. Therefore, when pulling the lead wires 1321 of the filter elements 13 bilaterally outwards and setting them in the respective wire grooves 114 of the insulative holder base 11 and the respective locating grooves 3121 of the tool base 31 of the supplementary tool 3 for soldering, the filter elements 13 can be firmly held in position.

As stated above, the main features of the present invention are: the insulative holder base 11 of the chip filter 1 has two opposing sidewalls 111, a recessed chamber 110 defined between the two sidewalls 111, two arrays of protruding blocks 113 respectively arranged along the sidewalls 111 adjacent to the recessed chamber 110 and protruding over the flat top edge 112 of each of the sidewalls 111, a wire groove 114 defined between each two adjacent protruding blocks 113 of each array of protruding blocks 113, a finished surface 115 formed on the flat top edge 112 of each of the sidewalls 111, and a plurality of soldering zones 116 defined in the finished surface 115 corresponding to the wire grooves 114; each connection terminal 12 has a base portion 121 positioned in one soldering zone 116 in the finished surface 115 of one sidewall 111 of the insulative holder base 11 of the chip filter 1, a soldering surface 1211 located on the base portion 121 and kept in flush with the top edge 112 of the associating sidewall 111, and a bonding tip 122 extended from the base portion 121 out of the associating sidewall 111 for bonding to one respective surface contact 21 at an external circuit board 2; the terminal ends of the lead wires 1321 of the windings 132 of the filter elements 13 are respectively inserted through the wire grooves 114 of the insulative holder base 11 of the chip filter 1 and respectively rested on the soldering surfaces 1211 of the connection terminals 12 for quick bonding by an automatic soldering machine. Further, a supplementary tool 3 is used for quick and accurate positioning of the lead wires 1321 on the soldering surfaces 1211 of the connection terminals 12 for quick bonding by an automatic soldering machine.

In conclusion, the invention provides a chip filter and the related supplementary tool, having advantages and features as follows:

1. Each connection terminal 12 has a base portion 121 positioned in one soldering zone 116 in the finished surface 115 of one sidewall 111 of the insulative holder base 11 of the chip filter 1, and a soldering surface 1211 located on the base portion 121 and kept in flush with the top edge 112 of the associating sidewall 111 and in alignment with one wire groove 114 of the insulative holder base 11; when the lead wires 1321 of the windings 132 of the filter elements 13 are respectively inserted through the wire grooves 114 of the insulative holder base 11 of the chip filter 1, they are respectively rested on the soldering surfaces 1211 of the connection terminals 12 for quick bonding by an automatic soldering machine.

2. The base portion 121 of each connection terminal 12 has a width greater than the width of the wire grooves 114; the opening, referenced by 120, at one side of the bonding tip 122 (see FIGS. 2~4) is aimed at one wire groove 114; when the lead wires 1321 are respectively inserted through the wire grooves 114, they are respectively rested on the soldering surfaces 1211 of the connection terminals 12 and bend downwardly through the openings 120 and stopped at one side of the bonding tips 122 for bonding to the soldering surfaces 1211 positively and accurately by an automatic soldering machine.

3. By means of insert-molding, the base portions 121 of the connection terminals 12 are respectively partially embedded in the sidewalls 111 of the insulative holder base 11 of the chip filter 1 corresponding to the respective soldering zones 116, and the bonding tips 122 of the connection terminals 12 are suspending on the outside for bonding to an external circuit board, facilitating fabrication and saving much the cost.

4. Subject to the application of the supplementary tool 3, the lead wires 1321 of the filter elements 13 can be automatically set in the respective wire grooves 114 of the insulative holder base 11 and the respective locating grooves 3121 and secured to the narrow crevices 33 of the tool base 31 of the supplementary tool 3 by a mechanical arm for quick bonding to the soldering surfaces 1211 of the base portions 121 of the connection terminals 12 by an automatic soldering machine, simplifying the fabrication and increasing the productivity.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:
1. A chip filter, comprising:
an insulative holder base, said insulative holder base comprising two opposing sidewalls, a recessed chamber defined between said two sidewalls, two arrays of protruding blocks respectively arranged along said sidewalls adjacent to said recessed chamber and protruding over a flat top edge of each of said sidewalls, a wire groove defined between each two adjacent protruding blocks of each said array of protruding blocks, a finished surface formed on the flat top edge of each of said sidewalls, and a plurality of soldering zones defined in said finished surface corresponding to said wire grooves;
a plurality of connection terminals, each said connection terminal comprising a base portion positioned in one soldering zone in said finished surface of one said sidewall of said insulative holder base, a soldering surface located on said base portion and kept in flush with the top edge of the associating sidewall, and a bonding tip extended from said base portion out of the associating sidewall for bonding to one respective surface contact of an external circuit board; and
a plurality of filter elements mounted in said recessed chamber of said insulative holder base, each said filter element comprising a metal core and a plurality of windings wound round said metal core, said windings each comprising a plurality of lead wires respectively extending out of said recessed chamber of said insulative holder base through the wire grooves of said insulative holder base and respectively soldered to the soldering surfaces of said connection terminals.

2. The chip filter as claimed in claim 1, wherein the base portion of each said connection terminal has a width greater than the width of the wire grooves of said insulative holder base; the bonding tip of each said connection terminal extends outwardly from an outer end of the associating base portion outside the associating sidewall of said insulative holder base.

3. The chip filter as claimed in claim 1, wherein each said connection terminal has an opening defined in a front side relative to the base portion at one side of the bonding tip thereof and aimed at one said wire groove.

4. The chip filter as claimed in claim 1, wherein the base portions of said connection terminals are positioned in said sidewalls of said insulative holder base during molding of said insulation holder base; each said connection terminal comprises an interference block extended upwardly from one end of the associating base portion opposite to the associating bonding tip and embedded in one said sidewall of said insulative holder base.

5. The chip filter as claimed in claim 1, wherein the bonding tip of each said connection terminal has a vertical segment connected to the associating base portion and embedded in the associating sidewall of said insulative holder base, a transverse segment extended from one end of said vertical segment remote from the associating base portion to the outside of the associating sidewall, a supporting segment vertically downwardly extended from one end of said transverse segment remote from said vertical segment and suspending outside said insulative holder base, and a bonding segment perpendicularly outwardly extended from a bottom end of said supporting segment for bonding to one surface contact of an external circuit board.

6. A chip filter and supplementary tool, comprising:
a chip filter, said chip filter comprising:
(a) an insulative holder base, said insulative holder base comprising two opposing sidewalls, a recessed chamber defined between said two sidewalls, two arrays of protruding blocks respectively arranged along said sidewalls adjacent to said recessed chamber and protruding over a flat top edge of each of said sidewalls, a wire groove defined between each two adjacent protruding blocks of each said array of protruding blocks, a finished surface formed on the flat top edge of each of said sidewalls, and a plurality of soldering zones defined in said finished surface corresponding to said wire grooves;
(b) a plurality of connection terminals, each said connection terminal comprising a base portion positioned in one soldering zone in said finished surface of one said sidewall of said insulative holder base, a soldering surface located on said base portion and kept in flush with the top edge of the associating sidewall, and a bonding tip extended from said base portion out of the associating sidewall for bonding to one respective surface contact of an external circuit board; and
(c) a plurality of filter elements mounted in said recessed chamber of said insulative holder base, each said filter element comprising a metal core and a plurality of windings wound round said metal core, said windings each comprising a plurality of lead wires respectively extending out of said recessed chamber of said insulative holder base through the wire grooves of said insulative holder base and respectively soldered to the soldering surfaces of said connection terminals; and
(d) a supplementary tool, said supplementary tool comprising:
(a) tool base, said tool base comprising a top recess for accommodating said insulative holder base, two pairs of stop blocks bilaterally disposed at two opposite lateral sides relative to said top recess, a holding space defined between each said pair of stop blocks at each of two opposite lateral sides of said top recess, a plurality of partition blocks and partition slots alternatively arranged in parallel in each said holding space between the associating two stop blocks, a series of protruding blocks arranged along each of the two opposite lateral sides of said top recess between the two stop blocks at each of the two opposite lateral sides of said top recess, and a plurality of locating grooves respectively defined between each two adjacent protruding blocks at each of the two opposite lateral sides of said top recess; and
(b) two retaining blocks respectively set in the two holding spaces at the two opposite lateral sides of said top recess between the respective stop blocks, each said retaining block having an elongated base and a plurality of teeth perpendicularly extended from one side said elongated base in a parallel relationship and respectively inserted into the partition slots in each of the holding spaces such that a narrow crevice is defined between one side of one said tooth and one respective partition block in axial alignment with one said locating groove at each of the two opposite lateral sides of said top recess for securing one said lead wire of said chip filter for bonding.

7. The chip filter and supplementary tool as claimed in claim 6, wherein said supplementary tool further comprises a cushion pad attached to said top recess of said tool base to adjust the depth of said top recess and to support said insulative holder base of said chip filter in said top recess.

8. The chip filter and supplementary tool as claimed in claim 6, wherein said supplementary tool further comprises two supporting bars selectively and detachably attached to said tool base at the two opposite lateral sides of said top recess for supporting the base portions of the connection terminals of said chip filter for bonding.

9. The chip filter and supplementary tool as claimed in claim 6, wherein said supplementary tool further comprises a cover member adapted to cap said chip filter on said tool base for soldering, said cover member having two shoulders symmetrically disposed at two opposite lateral sides thereof for setting in said top recess to hold down said filter elements of said chip filter and a plurality of end hooks symmetrically downwardly extended from two distal ends thereof and respectively detachably hooked in respective retaining grooves in said tool base.

10. The chip filter and supplementary tool combination as claimed in claim 6, wherein the base portion of each said connection terminal of said chip filter has a width greater than the width of the wire grooves of said insulative holder base; the bonding tip of each said connection terminal of said chip filter extends outwardly from an outer end of the associating base portion outside the associating sidewall of said insulative holder base; each said connection terminal of said chip filter has an opening defined in a front side relative to the base portion at one side of the bonding tip thereof and aimed at one said wire groove.

11. The chip filter as claimed in claim 6, wherein the base portions of said connection terminals of said chip filter are positioned in said sidewalls of said insulative holder base during molding of said insulation holder base; each said connection terminal comprises an interference block extended upwardly from one end of the associating base portion opposite to the associating bonding tip and embedded in one said sidewall of said insulative holder base.

* * * * *